United States Patent [19]

Hosomi et al.

[11] Patent Number: 5,038,200

[45] Date of Patent: Aug. 6, 1991

[54] RESIN INSULATED TYPE SEMICONDUCTOR DEVICE

[75] Inventors: Sadaki Hosomi, Hyogo; Kenji Unetsubo, Tatsuno; Yoshiaki Tatumi, Himeji, all of Japan

[73] Assignee: Kabushiki Kaisha Toshiba, Kawasaki, Japan

[21] Appl. No.: 618,591

[22] Filed: Nov. 28, 1990

Related U.S. Application Data

[63] Continuation of Ser. No. 245,597, Sep. 16, 1988, abandoned.

[30] Foreign Application Priority Data

Sep. 17, 1987 [JP] Japan .................. 62-232945

[51] Int. Cl.[5] ........................ H01L 23/02
[52] U.S. Cl. ........................... 357/81
[58] Field of Search ................. 357/74, 81

[56] References Cited

U.S. PATENT DOCUMENTS 4,750,030 6/1988 Hatakeyama ................ 357/81

OTHER PUBLICATIONS

Patent Abstracts of Japan, vol. 10, No. 184 (E-415) [2240], Jun. 27, 1986.
Patent Abstracts of Japan, vol. 10, No. 268 (E-436) [2324], Sep. 12, 1986.
Patent Abstracts of Japan, vol. 11, No. 41 (E-478) [2488], Feb. 6, 1987.

*Primary Examiner*—William L. Sikes
*Assistant Examiner*—Robert E. Wise
*Attorney, Agent, or Firm*—Finnegan, Henderson, Farabow, Garrett and Dunner

[57] ABSTRACT

An electrically-insulated type semiconductor device to be resin-moulded has a rear surface which can be set in direct contact with a heat radiation section and a front surface opposite to the rear surface. This semiconductor device includes a metal lead frame having a tip end portion sandwiched between the resin rear surface and resin front surface and a mounting portion on which a semiconductor chip is mounted, and frame supporting holes formed to penetrate from the resin front surface to the mounting portion of the lead frame. The frame supporting holes are formed by supporting pins for positioning the mounting portion of the lead frame. The frame supporting holes are formed only in the resin front surface, and the lead frame is formed in such a shape that a thickness of resin mould existing between the resin rear surface and the tip end portion of the lead frame is set to be larger than a thickness of resin mould existing between the resin rear surface and the mounting portion of the lead frame.

7 Claims, 3 Drawing Sheets

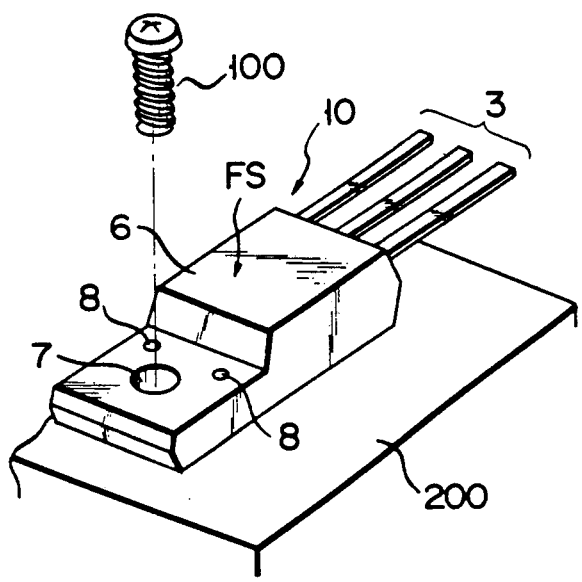
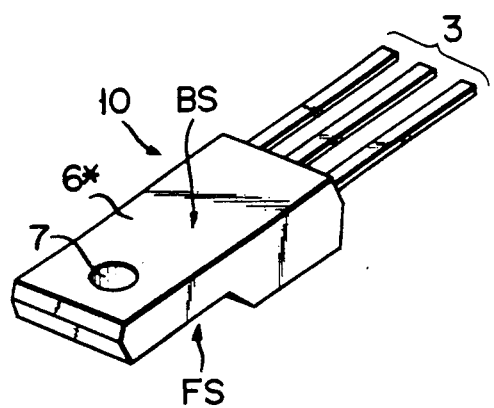
FIG. 1A  FIG. 1B
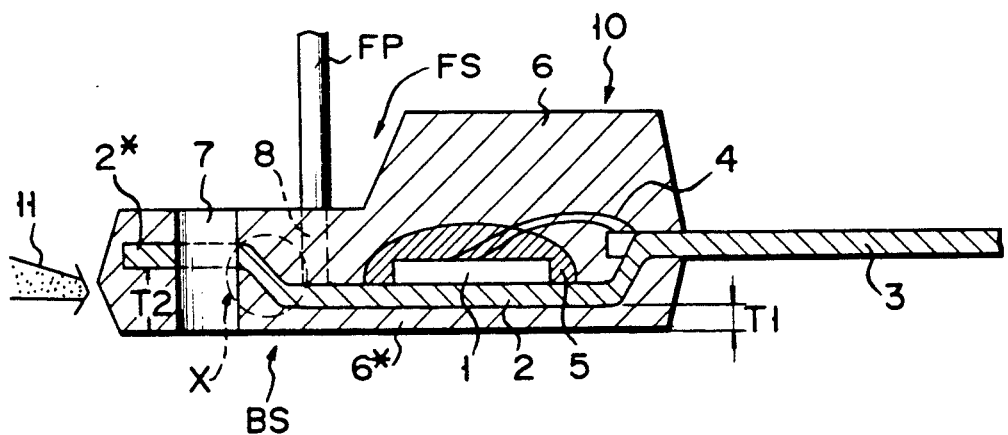
FIG. 2
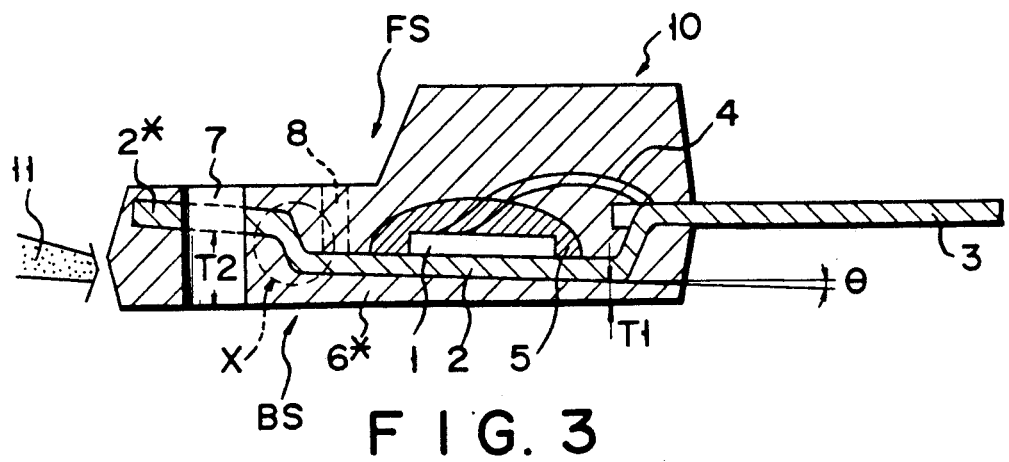
FIG. 3

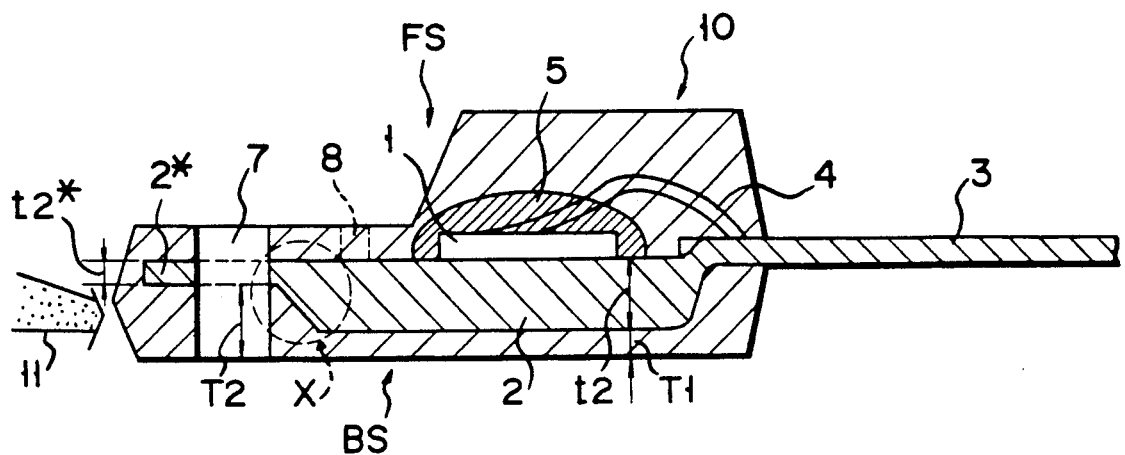
F I G. 4
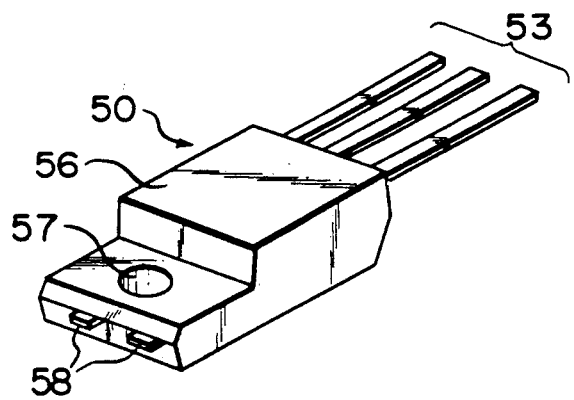
F I G. 5A
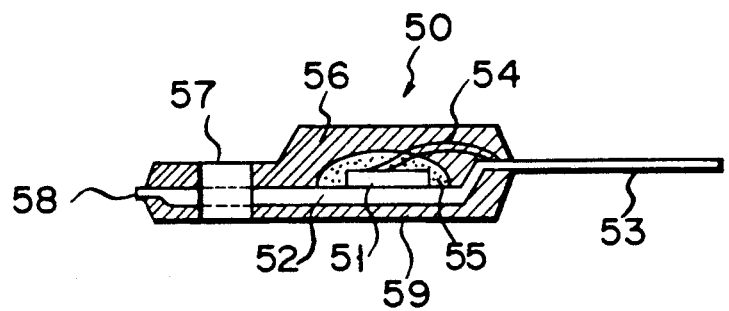
F I G. 5B

RESIN INSULATED TYPE SEMICONDUCTOR DEVICE

This application is a continuation of application Ser. No. 07/245,597, filed Sept. 16, 1988, and now abandoned.

BACKGROUND OF THE INVENTION

1. Field of the Invention

This invention relates to a resin packaged semiconductor device and, more particularly, to a resin insulated type semiconductor device having a thin resin film for electric insulation and heat conduction formed on the rear surface of a frame on which a semiconductor chip is mounted.

2. Description of the Related Art

A resin insulated type semiconductor device can be constructed as shown in FIGS. 5A and 5B or FIGS. 6A to 6C.

In semiconductor device 50 shown in FIGS. 5A and 5B, 51 denotes a semiconductor chip; 52, a chip mounting section (island) of a lead frame; 53, an external connection lead; 54, a lead wire for electrically connecting semiconductor chip 51 to outer connection lead 53; 55, a cap; 56, a moulded resin for an outer casing; 57, a mounting hole formed in part of the outer casing for fixing the semiconductor device; and 58, a frame fixing section formed at the tip end portion of the lead frame to extend out of the outer casing and used for fixing the lead frame in position when the lead frame is resin-sealed.

In semiconductor device 50, resin film 59 having thin and constant film thickness is formed on the rear surface side of island 52 by resin-sealing the load frame. When this resin-seal is performed, the tip end portion (frame fixing section 58) of the lead frame and the base end portion (outer connection lead 53) are fixed.

In semiconductor device 60 shown in FIGS. 6A to 6C, the lead frame is resin-sealed. When this resin-seal is performed, the front and rear surfaces of the lead frame are held by frame supporting pins of a metallic mould. The semiconductor device is similar to that of FIGS. 5A and 5B, except that the tip end portion of the lead frame does not exposed to the outer casing, and that frame supporting holes 61 and 62 are formed in the front and rear surfaces of the casing in position corresponding to the supporting portions of the lead frame. Portions in the semiconductor device of FIGS. 6A to 6C, which are the same as those in that of FIGS. 5A and 5B, are denoted by the same reference numerals.

In a case where semiconductor device 50 of FIGS. 5A and 5B is actually used, electrically conductive extraneous substances such as metal scrapings caused by use of a tap screw and/or wet dust may come into a gap between frame fixing section 58 and a metal member (for example, a chassis of electronic instruments or a heat radiation plate to which semiconductor device 50 is mounted) provided near the lead frame. In such a case, the dielectric strength of a portion between frame fixing section 58 and the metal member will be lowered. Further, since frame fixing section 58 is formed to extend out of the outer casing, an accident such as an electric shock may occur in the practical use.

In semiconductor device of FIGS. 6A to 6C, frame supporting holes 61 and 62 are formed in the front and rear surfaces of the outer causing, and the lead frame is exposed at the internal portion (bottom portion) of frame supporting holes 61 and 62. In the practical use, part of the lead frame, which is exposed at the internal portion of frame supporting hole 62 on the rear surface side, faces a metal member (heat radiation plate or chassis) provided near the lead frame. The dielectric strength of the rear surface of the semiconductor device is determined by the dielectric strength of the facing portion. If metal scrapings are entered into the facing portion, the dielectric strength of the rear surface of the semiconductor device is lowered.

In order to solve the problem described above, it may be considered that the exposed portion of the lead frame (such as the tip end portion of the frame and the exposed frame in the frame supporting hole) may be coated with insulative resin (for example, epoxy resin or silicone resin) after the resin-sealing operation. However, in this case, it is difficult to perform the desired coating operation because of limitations due to the size of the outer causing and the like. Thus, it is almost impossible to sufficiently enhance the dielectric strength even if the insulative film is coated. Further, the insulative film could be accidentally peeled off and thus the reliability thereof is not sufficiently high.

As described above, the semiconductor device having the frame supporting holes formed in the front and rear surfaces of the outer casing is mounted on the heat radiation plate or the like. At this time, the dielectric strength of the semiconductor device is determined by the exposed portion of the frame inside the frame supporting holes and the mounting heat radiation plate which faces the exposed portion. In this case, if conductive foreign material is introduced into the facing portion, the dielectric strength is lowered.

SUMMARY OF THE INVENTION

This invention has been made to solve the above problem, and an object of this invention is to provide a resin insulated type semiconductor device in which the dielectric strength of a portion between the exposed portion of the lead frame inside the frame supporting hole formed in the outer casing and the mounting heat radiation plate will not be lowered by the presence of electrically conductive extraneous substances.

According to a resin insulated type semiconductor device of this invention, an moulded resin for an outer casing is formed such that a thin resin film for electric insulation and heat conduction is formed on the rear surface side of the island portion of a frame on which a semiconductor chip is mounted. In this formation, the moulding is performed without making the tip end portion of the lead frame extend to the external, and a frame supporting hole, which is formed by a frame support pin of a metallic mould for supporting part of the lead frame at the time of formation of the moulded resin, is present not in the rear surface but in the front surface of the lead frame.

The tip end portion of the lead frame is formed so as not to extend out of the outer casing and the frame supporting hole is not formed in the rear surface of the outer casing. Therefore, when the rear surface of the semiconductor device is mounted on a metal plate such as a heat radiation plate, the dielectric strength of a portion between the lead frame and the metal plate is not lowered by electrically conductive extraneous substances.

BRIEF DESCRIPTION OF THE DRAWINGS

FIGS. 1A and 1B are perspective views showing the front surface side and the rear surface side of a resin insulated type semiconductor device according to one embodiment of this invention;

FIG. 2 is a vertical cross sectional view of FIG. 1A;

FIGS. 3 and 4 are cross sectional views showing other embodiments of this invention;

FIGS. 5A and 5B are perspective and cross sectional views of a frame fixed type resin insulated type semiconductor device.

DETAILED DESCRIPTION OF THE PREFERRED EMBODIMENTS

Figure 6A:
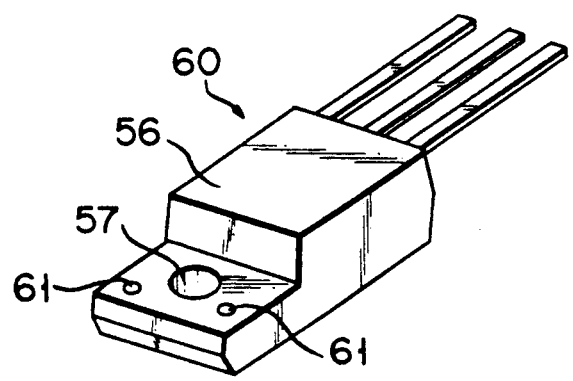
FIGS. 6A, 6B, and 6C are front and rear surface side perspective views and a cross sectional view of a resin insulated type semiconductor device of frame supporting type.
Figure 6B:
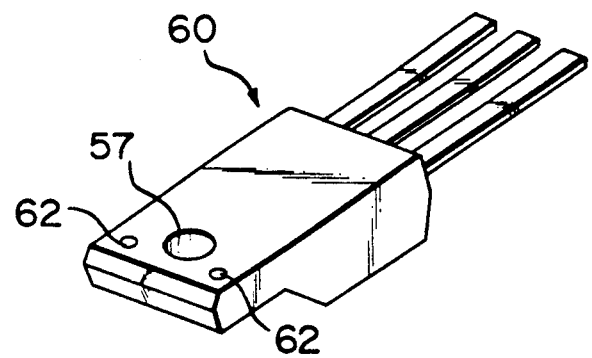
Figure 6C:
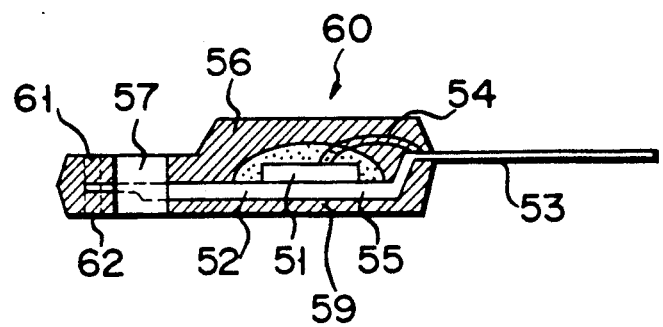

There will now be described a resin insulated type semiconductor device according to one embodiment of this invention with reference to the accompanying drawings. In the drawings, the same reference numerals are used to denote the same portions and the duplicate explanation is avoided.

In semiconductor device 10 shown in FIGS. 1A and 1B and FIG. 2, 1 denotes a semiconductor chip; 2, a chip mounting section (island) of a lead frame; 3, outer connection leads for the lead frame; 4, a lead wire (bonding wire) for electrically connecting semiconductor chip 1 to outer connection lead 3; 5, a cap (of, for example, silicone rubber resin) coated and formed to cover semiconductor chip 1; 6, moulded resin (for example, epoxy resin) for an outer casing; 7, a semiconductor device mounting hole formed through moulded resin 6; and 8, frame supporting holes formed in moulded resin 6 on front surface side FS of lead frame (2, 3) by frame supporting pins FP. Device 10 can be directly fixed on head sink 200 of, for example, aluminum by means of screw 100.

Part of island 2 of the lead frame is kept in contact with supporting pins FP until the mould formation is completed, and thus the lead frame can be adequately positioned.

Moulded resin 6 is formed to have electrically insulative and heat-conductive thin resin film 6* formed on rear surface side BS of chip mounting section 2 and is so formed that tip end portion 2* of the lead frame will not extend out of moulded resin 6. The lead frame (2, 3) is formed to have a bent portion (X) so that the position (T1) of rear surface BS of chip mounting section 2 can be set lower than the position (T2) of the tip end portion 2*. In other words, distance T1 from the rear surface of chip mounting section 2 to the surface of resin film 6* is set to by smaller than distance T2 from the rear surface of tip end portion 2* to the surface of resin film 6*. The values of T1 and T2 are set according to the specification and design of the outer casing (6), and in this example, T1=0.3 mm and T2=1.0 mm.

With semiconductor device 10 in the above embodiment, front surface FS of the lead frame is exposed in frame supporting holes when rear surface side BS of semiconductor device 10 is mounted on a mounting metal plate such as heat radiation plate 200. In this case, however, since the entire portion of rear surface side BS of the lead frame is insulated by resin film 6*, there is no possibility that the dielectric strength of resin film 6* will be lowered by conductive extraneous substances.

Further, it has been found that when the moulding is effected without supporting rear surface BS of the lead frame by means of supporting pins FP, even if variation in thickness T1 of resin film 6* occurs, the variation has no practical bad influence. That is, in the above embodiment, variation in thickness T1 of resin film 6* ranges from +5% to -7%, and becomes slightly larger in comparison with the variation of +5% in a usual case. However, any practical problem caused by the above slightly-large variation can be prevented by changing the designed value of thickness T1 (for example, by increasing the design center value of thickness T1 to be slightly larger than the original value).

When semiconductor device 10 is moulded, base end plate (outer connection lead) 3 of the lead frame is first fixed with tip end portion 2* of the lead frame and chip mounting section 2 set in the metal mould. Then, molten resin 11 is injected by pressure into a space under tip end portion 2* of the lead frame via a resin inlet (provided below tip end portion 2* of the lead frame) of the metal mould. At this time, tip end portion 2* of the lead frame is lifted by the action of viscosity of molten resin 11, and the lead frame is fixed with the upper surface thereof set in contact with frame supporting pins (not shown) which are formed inside the metal mould. In this case, since no pin is provided to support rear surface BS of the lead frame, no frame supporting hole is formed in rear surface BS after the resin moulding is completed.

This invention is not limited to the above embodiment. For example, various modifications can be made as shown in FIGS. 3 and 4.

Semiconductor device 10 shown in FIG. 3 is similar to the semiconductor device of the former embodiment shown in FIG. 2 except that bending angle 8 of the lead frame is set to a different value. In this case, bending angle θ on the base end plate side is so set that tip end portion 2* can be positioned higher than base end plate (outer connection lead) 3 of chip mounting section 2. The lead frame described above has an advantage that the thickness of resin film 6* on the rear surface side can be adjusted according to the position of the supporting pins on front surface FS of the lead frame in the mould resin sealing operation.

Semiconductor device 10 shown in FIG. 4 is similar to the semiconductor device of the former embodiment shown in FIG. 2 except for the shape of the lead frame. With the lead frame, the upper surface of chip mounting section 2 and the upper surface of tip end portion 2* are plated on the same plane, and thickness t2* of tip end portion 2* is made smaller than thickness t2 of chip mounting section 2.

In each of the embodiments, cap 5 can be omitted as the case may be.

As described above, according to the resin insulated type semiconductor device of this invention, the tip end portion of the lead frame is formed so as not to extend out of the outer casing and no frame supporting hole is formed in the rear surface of the outer casing. Therefore, when the rear surface is mounted on a metal plate such as heat radiation plate, the dielectric strength of a portion between the lead frame and the metal plate will not be lowered. In a condition that the lead frame is mounted on the metal plate, the dielectric strength is 2 to 2.5 kV in a conventional frame fixing type semiconductor device and 3 to 3.5 kV in a conventional frame supporting type semiconductor device. In contrast, in the semiconductor device of this invention being equivalent in scale to the above conventional semiconductor device, the dielectric strength of 5 kV or more can be obtained, and thus the dielectric strength of mould resin film 6* on the rear surface side can be significantly improved.

What is claimed is:

1. A semiconductor device encapsulated during a mold resin sealing operation comprising a molded resin for an outer casing of a lead frame, said molded resin being formed to have a thin rear surface resin film for electrical insulation and heat conduction, said thin rear surface resin film being formed on a rear surface side of a semiconductor mounting portion of said lead frame, and said molded resin being formed without making a tip end portion of said lead frame extend from said molded resin,
 wherein a frame supporting hole, which is formed by a frame supporting pin of a mold for supporting a part of said lead frame at the time of the mold resin sealing operation, is present only on the front surface of said lead frame and the mounting portion of said lead frame is formed with a given preset angle with respect to said resin rear surface, said angle being adjustable according to the position of the supporting pin during the mold resin sealing operation.

2. A resin insulated type semiconductor device according to claim 1, wherein said lead frame is formed in such a shape that a distance of the tip end portion of said lead frame from said rear surface resin film is set to be longer than that of said semiconductor chip mounting portion from said rear surface resin film.

3. A resin insulated type semiconductor device according to claim 2, wherein said semiconductor chip mounting portion is formed to have a bent portion which is formed between an outer connection lead portion of said lead frame and said semiconductor chip mounting portion and whose bending angle is so determined as to make a distance of the tip end portion of said lead frame from said rear surface resin film longer than that of said outer connection lead portion from said rear surface resin film.

4. A resin insulated type semiconductor device according to claim 1, wherein said lead frame is so formed that the upper surface of said semiconductor chip mounting portion and the upper surface of the tip end portion of said lead frame are positioned in the same plane, and the thickness of the tip end portion of said lead frame is set to be smaller than that of said semiconductor chip mounting portion.

5. A semiconductor device encapsulated within a resin mold having a resin rear surface which can be set in direct contact with a heat radiation section and a resin front surface opposite to the resin rear surface, comprising:
 a semiconductor chip;
 a metal lead frame having a tip end placed between said resin rear surface and resin front surface and a mounting portion on which said semiconductor chip is mounted; and
 a frame supporting hole formed to penetrate from said resin front surface to the mounting portion of said lead frame, said frame supporting hole being formed by a supporting pin for positioning the mounting portion of said lead frame during a mold resin sealing operation, said frame supporting hole formed only in said resin front surface,
 said lead frame formed in such a shape that a second thickness of a resin mold existing between said resin rear surface and the tip end of said lead frame is set to be larger than a first thickness of the resin mold existing between said resin rear surface and the mounting portion of said lead frame; and
 the mounting portion of said lead frame is formed at an angle with respect to said resin rear surface, said angle being adjustable according to the position of the supporting pin during the mold resin sealing operation.

6. A semiconductor device according to claim 5, wherein said lead frame has a bent portion formed between the mounting portion and the tip end portion and causing said second thickness to be larger than said first thickness.

7. A semiconductor device according to claim 5, wherein said lead frame is formed to have the mounting portion whose thickness is set to be larger than a thickness of the tip end portion so as to make said second thickness larger than said first thickness.

* * * * *